(12) United States Patent
Wu

(10) Patent No.: US 11,955,511 B2
(45) Date of Patent: *Apr. 9, 2024

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventor: Shuangshuang Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 361 days.

This patent is subject to a terminal disclaimer.

(21) Appl. No.: 17/487,636

(22) Filed: Sep. 28, 2021

(65) Prior Publication Data

US 2022/0085151 A1 Mar. 17, 2022

Related U.S. Application Data

(63) Continuation of application No. PCT/CN2021/103854, filed on Jun. 30, 2021.

(30) Foreign Application Priority Data

Sep. 11, 2020 (CN) .......................... 202010956160.9

(51) Int. Cl.
*H10B 12/00* (2023.01)
*H01L 49/02* (2006.01)

(52) U.S. Cl.
CPC ............. *H01L 28/91* (2013.01); *H10B 12/00* (2023.02); *H10B 12/033* (2023.02); *H10B 12/09* (2023.02)

(58) Field of Classification Search
CPC ... H01L 28/90–92; H01L 28/91; H10B 12/03; H10B 12/033; H10B 12/09; H10B 12/30
See application file for complete search history.

(56) References Cited

U.S. PATENT DOCUMENTS 8,274,777 B2 9/2012 Kiehlbauch
9,041,154 B2 5/2015 Yu et al.
(Continued)

FOREIGN PATENT DOCUMENTS

CN 101990710 A 3/2011
CN 104037176 A 9/2014
(Continued)

OTHER PUBLICATIONS

Supplementary European Search Report in the European application No. 21865655.1, dated Dec. 18, 2023. 7 pages.

*Primary Examiner* — Jose R Diaz
(74) *Attorney, Agent, or Firm* — Cooper Legal Group, LLC

(57) ABSTRACT

A semiconductor structure and a method for manufacturing the semiconductor structure are provided. The method for manufacturing the semiconductor structure includes: providing a substrate, in which the substrate includes an array area and a peripheral area adjacent to each other, and the array area includes a buffer area connected to the peripheral area; forming a first dielectric layer, a first supporting layer, a second dielectric layer, a second supporting layer and a third dielectric layer, which are successively stacked onto one another, on the substrate, forming a groove-type lower electrode, which at least penetrates through the third dielectric layer and the second supporting layer, in the buffer area; removing the third dielectric layer through a wet etching process; and etching the second supporting layer in the peripheral area after removing the third dielectric layer.

13 Claims, 11 Drawing Sheets

(56) References Cited

U.S. PATENT DOCUMENTS

| | | |
|---|---|---|
| 9,076,680 B2 | 7/2015 | Busch |
| 2003/0178684 A1 | 9/2003 | Nakamura |
| 2006/0014344 A1* | 1/2006 | Manning .............. H10B 12/033 |
| | | 438/243 |
| 2009/0251845 A1 | 10/2009 | Kiehlbauch |
| 2009/0275185 A1* | 11/2009 | Shea ...................... H10B 12/09 |
| | | 216/6 |
| 2013/0093050 A1 | 4/2013 | Busch |
| 2013/0286715 A1 | 10/2013 | Ikeda |
| 2014/0252545 A1 | 9/2014 | Yu et al. |
| 2018/0158827 A1 | 6/2018 | You et al. |
| 2022/0085152 A1* | 3/2022 | Wu ......................... H01L 28/91 |

FOREIGN PATENT DOCUMENTS

| | | |
|---|---|---|
| CN | 107706206 A | 2/2018 |
| CN | 207781561 U | 8/2018 |
| CN | 108550569 A | 9/2018 |
| CN | 208521929 U | 2/2019 |
| CN | 110970403 A | 4/2020 |
| TW | I383472 B | 1/2013 |

\* cited by examiner

SEMICONDUCTOR STRUCTURE AND METHOD FOR MANUFACTURING SEMICONDUCTOR STRUCTURE

CROSS-REFERENCE TO RELATED APPLICATIONS

This is a continuation application of International Patent Application No. PCT/CN2021/103854, filed on Jun. 30, 2021, which claims priority to Chinese Patent Application No. 202010956160.9, filed on Sep. 11, 2020 and entitled "SEMICONDUCTOR STRUCTURE AND METHOD FOR MANUFACTURING SEMICONDUCTOR STRUCTURE". The disclosures of International Patent Application No. PCT/CN2021/103854 and Chinese Patent Application No. 202010956160.9 are incorporated by reference herein in their entireties.

TECHNICAL FIELD

An embodiment of the disclosure relates to the field of semiconductors, in particular to a semiconductor structure and a method for manufacturing the semiconductor structure.

BACKGROUND

As the size of the semiconductor structure shrinks, it becomes more and more difficult to increase or maintain the capacitance value of an individual capacitance structure. When using the same dielectric layer material, the capacitance value may be increased only by increasing the surface area of an electrode plate or reducing the thickness of a dielectric layer.

At present, the capacitance structure usually adopts a double-sided capacitance structure with a supporting layer. During the formation of the double-sided capacitance structure, etching defects frequently occur due to the edge size effect of a capacitor array and the etching load effect.

SUMMARY

An embodiment of the disclosure provides a semiconductor structure and a method for manufacturing the semiconductor structure, which are beneficial to avoid damage to a substrate in a peripheral area.

According to a first aspect of the embodiments of the disclosure, a method for manufacturing a semiconductor structure is provided. The method includes the following operations. A substrate is provided, in which the substrate includes an array area and a peripheral area adjacent to each other, and the array area includes a buffer area connected to the peripheral area. A first dielectric layer, a first supporting layer, a second dielectric layer, a second supporting layer and a third dielectric layer, which are successively stacked onto one another, are formed on the substrate, in which the first supporting layer is arranged at least in the peripheral area, the first dielectric layer is arranged between the first supporting layer and the substrate, the second dielectric layer covers the first supporting layer and the substrate, and each of the second supporting layer and the third dielectric layer is arranged in the array area and the peripheral area. A groove-type lower electrode, which at least penetrates through the third dielectric layer and the second supporting layer, is formed in the buffer area, in which a bottom surface the groove-type lower electrode is located in the first dielectric layer or in the second dielectric layer. The third dielectric layer is removed through a wet etching process. The second supporting layer in the peripheral area is etched after removing the third dielectric layer.

According to a second aspect of the embodiments of the disclosure, a semiconductor structure is provided. The semiconductor structure includes: a substrate, in which the substrate includes an array area and a peripheral area adjacent to each other, and the array area includes a buffer area connected to the peripheral area; a first supporting layer and a second supporting layer, in which the first supporting layer is arranged in the peripheral area, the second supporting layer is arranged in the array area, and the second supporting layer is higher than the first supporting layer; and a groove-type lower electrode, in which the groove-type lower electrode is arranged in the buffer area and penetrates through the second supporting layer, a bottom surface the groove-type lower electrode is higher than a surface of the substrate and lower than the first supporting layer, or a bottom surface of the groove-type lower electrode is higher than the first supporting layer and lower than the second supporting layer.

BRIEF DESCRIPTION OF THE DRAWINGS

One or more embodiments are exemplarily explained through the figures in the accompanying drawings corresponding thereto, these exemplary explanations do not constitute a limitation to the embodiments; and unless otherwise specifically declared, the figures in the accompanying drawings do not constitute a limitation of proportion.

DETAILED DESCRIPTION

FIG. 1 to FIG. 4 are schematic diagrams of structures corresponding to various operations in a method for manufacturing a semiconductor structure.

Figure 1:
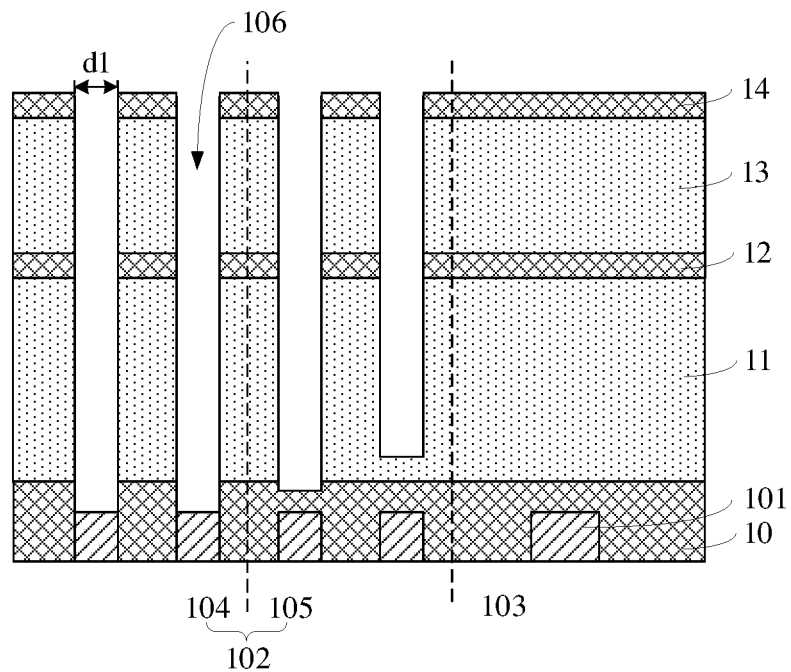
FIG. 1-FIG. 4 are schematic sectional diagrams of structures corresponding to various operations in a method for manufacturing a semiconductor structure.
Figure 2:
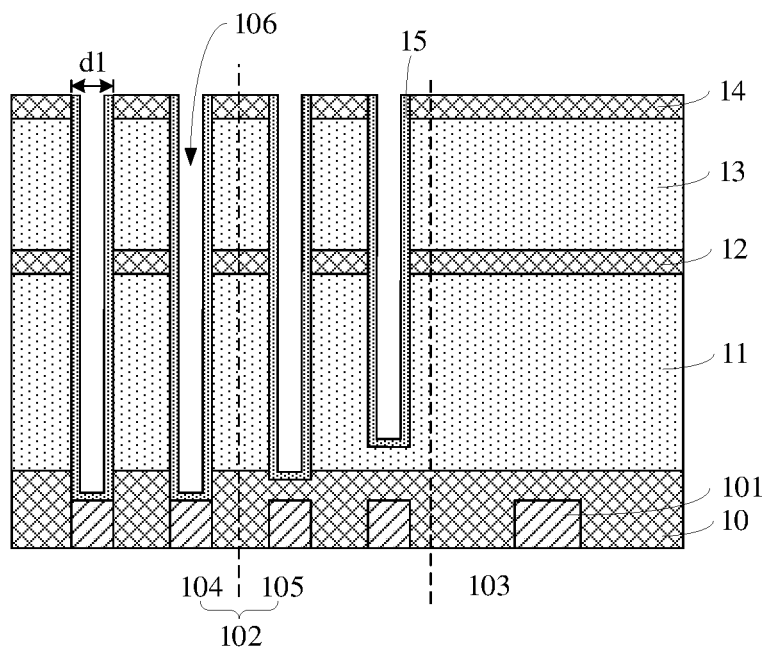

Referring to FIG. 1 and FIG. 2, a capacitance tank 106 exposing a conductive structure 101 is formed in the array area 102, and the capacitance tank 106 is configured to form a groove-type lower electrode 15.

The substrate 10 may be divided into an array area 102 and a peripheral area 103. The array area 102 includes a functional area 104 in the center of the array area 102 and a buffer area 105 at the edge of the array area 102. The conductive structure 101 is arranged in the substrate 10.

During the formation of the capacitance tank 106, due to the edge size effect, a width d1 of a top opening of the capacitance tank 106 is gradually reduced in a direction from the array area 102 to the peripheral area 103. Meanwhile, due to the etching load effect, the etching depth of the capacitance tank 106 in the buffer area 105 is relatively shallow, that is, the bottom surface of the capacitance tank 106 in the buffer area 105 may be located in the substrate 10 without exposing the conductive structure, or may be located in the first dielectric layer 11.

In addition, during the formation of the groove-type lower electrode 15 by performing a deposition process, since the width d1 of the top opening of the capacitance tank 106 in the buffer area 105 is relatively small, and the depth-to-width ratio is slightly larger, it is difficult for the electrode material to uniformly cover any surface of the capacitance tank 106. Thus, the groove-type lower electrode 15 in the buffer area 105 may have an abnormal deposition thickness. Specifically, a hole is formed at the bottom portion of the groove-type lower electrode 15 due to uneven deposition thickness of the groove-type lower electrode, and the etching solution on the inner side of the groove-type lower electrode 15 may flow to the outer side of the groove-type lower electrode 15 through the hole, so as to etch the first dielectric layer 11.

Figure 3:
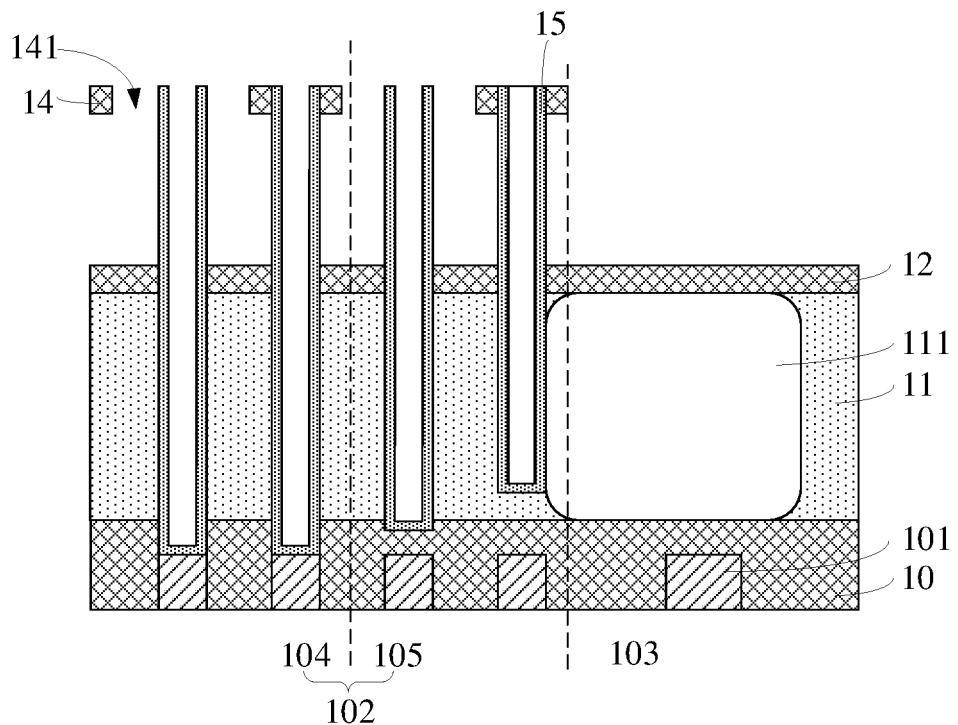

Referring to FIG. 3, the second supporting layer 14 is etched to form a first opening 141, and the second dielectric layer 13 (referring to FIG. 2) is removed through the first opening 141.

During the etching of the second dielectric layer 13, the groove-type lower electrodes 15 with an exposed top opening are provided in the buffer area 105, and the bottom surfaces of a portion of groove-type lower electrodes 15 are located in the first dielectric layer 11. Thus, the etching solution for etching the second dielectric layer 13 contacts the first dielectric layer 11 through the hole at the bottom portion of the groove-type lower electrode 15 to etch the first dielectric layer 11, so that a leakage hole 111 is formed in the first dielectric layer 11. The leakage hole 111 may penetrate through the first dielectric layer 11.

Figure 4:
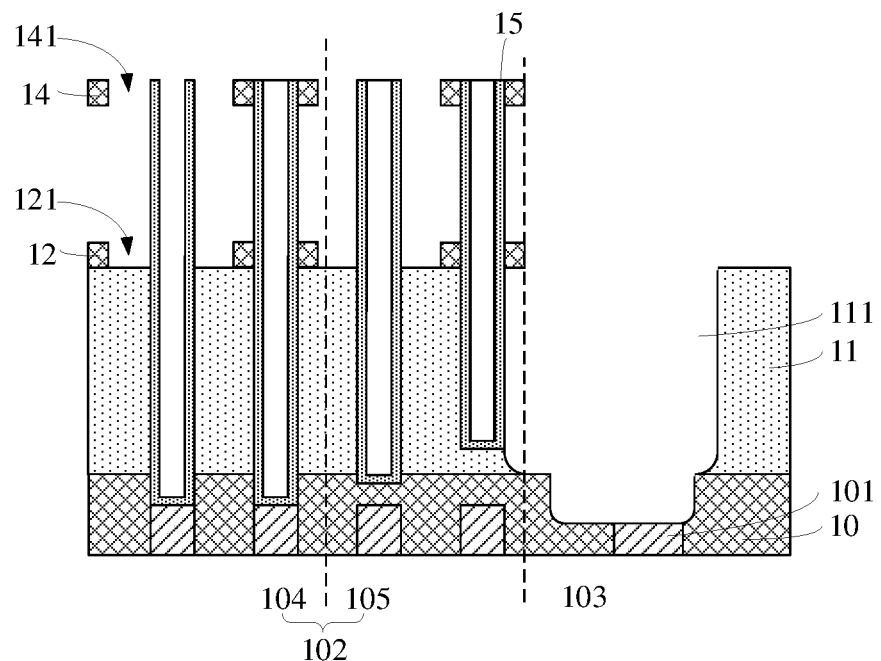

Referring to FIG. 4, the first supporting layer 12 is etched to form a second opening 121.

During the formation of the second opening 121, the first supporting layer 12 in the array area 102 and the peripheral area 103 needs to be etched. Since the leakage hole 111 penetrates through the first dielectric layer 11 to expose the substrate 10, after etching through the first supporting layer 12 in the peripheral area 103, the etching solution will flow to the surface of the substrate 10 through the leakage hole 111 to continuously etch the substrate 10, so that a portion of the substrate 10 is over-etched, and even that the metal layer of the conductive structure 101 is peeled.

In order to solve the abovementioned problem, the embodiments of the disclosure provide a semiconductor structure and a method for manufacturing the semiconductor structure. The dielectric layer between the second supporting layer and the substrate is divided into two layers by setting the first supporting layer. Further, the etching solution flowing out of the hole at the bottom portion of the groove-type lower electrode will be only in contact with one of the dielectric layers by adjusting the position relationship between the first supporting layer and the bottom surface of the groove-type lower electrode, so that the leakage hole will only exist in one dielectric layer. In this way, during the process of etching the second supporting layer, even if the second supporting layer is etched through, the etching solution will not directly contact the substrate, but will be isolated by the first dielectric layer or the second dielectric layer with an intact structure, so as to ensure the structural integrity and the functional integrity of the substrate and conductive structure in the peripheral area.

In order to make the objectives, technical solution and advantages of the embodiments of the disclosure more apparent, hereinafter, the respective embodiments of the disclosure will be described in detail in connection with the accompanying drawings. However, those ordinary skilled in the art may understand that, in the respective embodiments of the disclosure, numerous technical details are set forth in order to provide a reader with a better understanding of the disclosure. However, the technical solutions claimed in the disclosure can also be implemented without these technical details and various changes and modifications based on the respective embodiments below.

FIG. 5 to FIG. 19 are schematic diagrams of structures corresponding to various operations in a method for manufacturing a semiconductor structure according to an embodiment of the disclosure.

Figure 5:
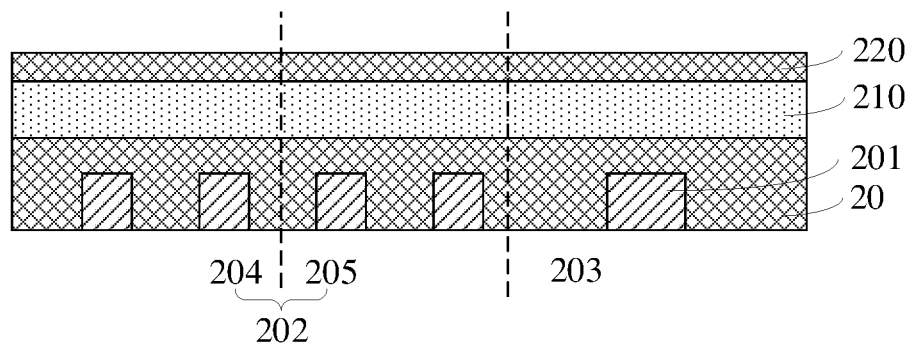
FIG. 5-FIG. 19 are schematic diagrams of structures corresponding to various operations in a method for manufacturing a semiconductor structure according to an embodiment of the disclosure.

Referring to FIG. 5, the substrate 20, as well as a first dielectric film 210 and a first supporting film 220 which are arranged on the substrate 20, are provided The substrate 20 includes the array area 202 and the peripheral area 203 adjacent to each other. The array area 202 includes a functional area 204 in the center of the array area and a buffer area 205 at the edge of the array area. Multiple conductive structures 201 are provided in the substrate 20, and the conductive structures 201 are arranged in the functional area 204, the buffer area 205 and the peripheral area 203.

In this embodiment, the material of each of the substrate 20 and the first supporting film 220 contains silicon nitride, and the silicon nitride in the substrate 20 may be used as an isolation structure to achieve an electrical isolation effect. The material of the first dielectric film 210 contains silicon dioxide. The conductive structure 201 may be a conductive contact area arranged in the substrate 20, for example an active area. The conductive structure 201 may also be an independent conductive plug made of the metal material, for example a tungsten block.

Figure 6:
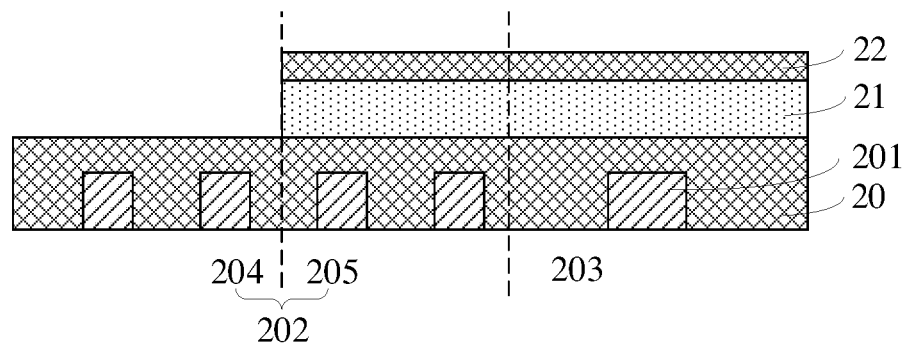

Referring to FIG. 6, the first dielectric film 210 and the first supporting film 220 in the functional area 204 are removed, the remaining portion of the first dielectric film 210 is configured as the first dielectric layer 21, and the remaining portion of the first supporting film 220 is configured as the first supporting layer 22.

In this embodiment, the first supporting layer 22 is not only arranged in the peripheral area 203, but also arranged in the buffer area 205. The first supporting layer 22 may provide support for the groove-type lower electrode subsequently formed in the buffer area 205, so as to prevent the groove-type lower electrode from being broken due to lack of support to form defects.

In addition, due to the isolation of the first supporting layer 22, it is possible to retain the first dielectric layer 21 as much as possible by controlling the etching time in the wet etching process, so that the first dielectric layer 21 is avoided from being over-etched during the process of etching the second dielectric layer in contact with the first dielectric layer.

The retained first dielectric layer 21 may be used as an additional supporting structure of the semiconductor structure to play a role of supporting the groove-type lower electrode and the conductive plug. The groove-type lower electrode is arranged in the buffer area 205, and the conductive plug is arranged in the peripheral area 203. In addition, the first dielectric layer 21 is retain, which is beneficial to avoid the upper electrode material from being deposited between the first supporting layer 22 and the substrate 20, and to reduce the process operations and shorten the process cycle without setting an addition operation for cleaning the upper electrode material or re-forming the dielectric layer for electrically isolating the upper electrode from the conductive plug.

Figure 7:
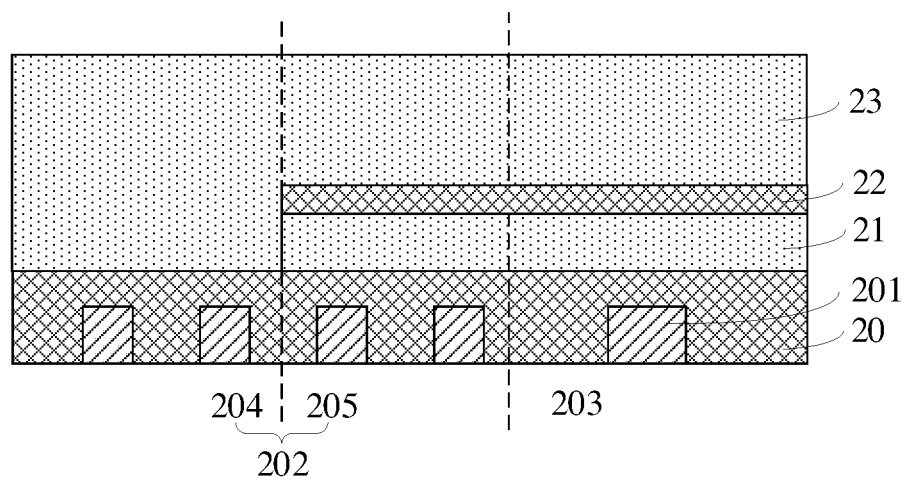
Figure 8:
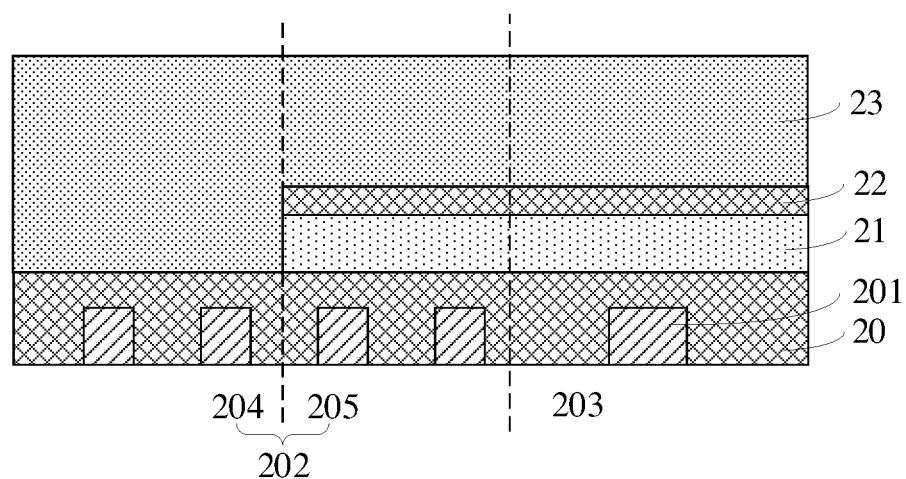

Referring to FIG. 7 and FIG. 8, the second dielectric layer 23 is formed, and the second dielectric layer 23 is performed ions doping, so as to increase the etching rate of the second dielectric layer 23 in the wet etching process.

In this embodiment, the material of the second dielectric layer 23 may be the same as the material of the first dielectric layer 21. In this embodiment, the second dielectric layer 23 is performed ions doping, which is beneficial to increase the etch selectivity ratio of the second dielectric layer 23 to the first dielectric layer 21, so that the etching of the first dielectric layer 21 with the etching solution is minimized during the process of subsequently etching the second dielectric layer 23, thereby ensuring that the first dielectric layer 21 has a relatively complete structure.

Figure 9:
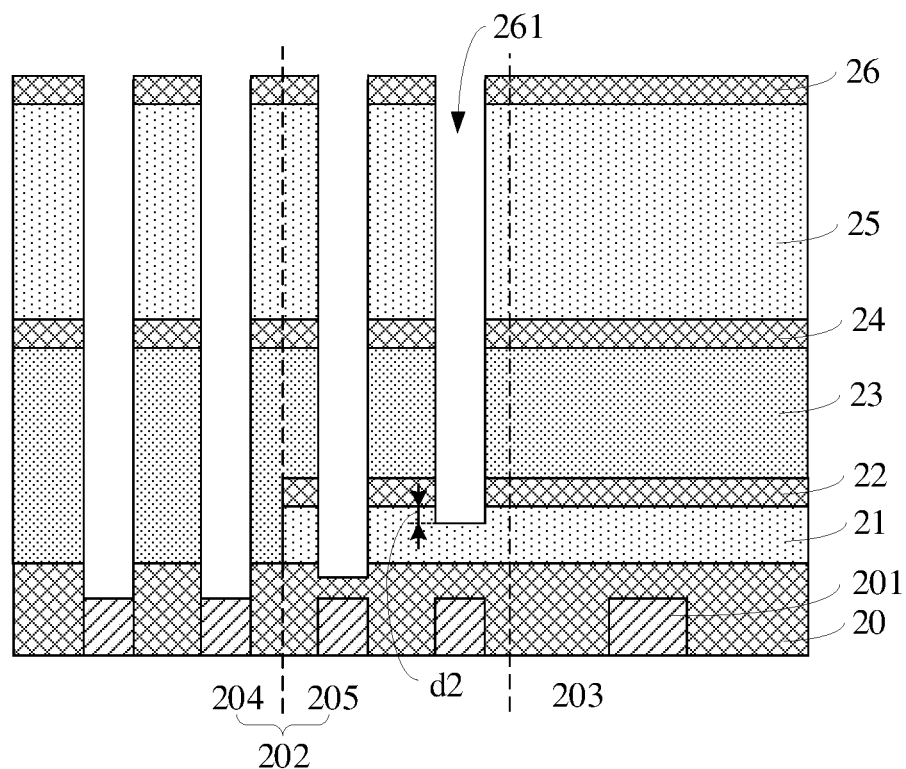

Referring to FIG. 9, the second supporting layer 24, the third dielectric layer 25 and the third supporting layer 26 are successively formed. The capacitance tanks 261 in the functional area 204 and the buffer area 205 are formed.

The material of each of the second supporting layer 24 and the third supporting layer 26 contains silicon nitride, and the material of the third dielectric layer 25 contains silicon dioxide.

Due to the edge size effect and the etching load effect, the capacitance tank 261 in the functional area 204 may expose the conductive structure 201 in the substrate 20, and there is gap between the bottom surface of the capacitance tank 261 in the buffer area 205 and the conductive structure 201. Specifically, the bottom surface of the capacitance tank 261 in the buffer area 205 is located in the substrate 20, the first dielectric layer 21 or the second dielectric layer 23.

In this embodiment, the bottom surface of the capacitance tank 261 in the buffer area 205 is located in the substrate 20 or the first dielectric layer 21. In this way, when the etching solution leaks, the leakage hole is only formed in the first dielectric layer 21, and the second dielectric layer 23 may be kept intact. The second dielectric layer 23 may block the etching solution for etching the second supporting layer 24, so as to avoid the etching solution from etching the first supporting layer 22, thereby ensuring that the first supporting layer 22 may support the groove-type lower electrode in the buffer area 205.

In some embodiments, the bottom surface of the capacitance tank in the buffer area is located in the substrate or the second dielectric layer. It should be noted that this embodiment is based on the fact that no leakage occurs to the groove-type lower electrode of which the bottom surface is located in the substrate. When the leakage also occurs to the groove-type lower electrode of which the bottom surface is located in the substrate, the bottom surface of the groove-type lower electrode in the buffer area is limited in the first dielectric layer on the substrate, which is beneficial to avoid the leakage holes from being formed in both of the first dielectric layer and the second dielectric layer, so that the etching solution is avoided from etching through the first supporting layer to contact the substrate, thereby ensuring the preset performances of the substrate and the conductive structure.

In this embodiment, in a direction perpendicular to the surface of the substrate 20, the height difference d2 between the bottom surface of the capacitance tank 261 and the first supporting layer 22 is comprised between 90 nm and 110 nm, for example, 95 nm, 100 nm or 105 nm. Since the hole defect usually occurs in the corner area at the bottom portion of the groove-type lower electrode, it is necessary to control the holes on the side wall of the groove-type lower electrode to be located in the first dielectric layer 21. That is, the thickness of the distribution area of the holes is less than or equal to the height difference d2, so as to ensure that the leaking etching solution only etches the first dielectric layer 21, thereby ensuring that the second dielectric layer 23 has a better structural integrity.

In this embodiment, the height difference d2 is vertical distance between the bottom surface of the capacitance tank 261 and the bottom surface of the first supporting layer 22, excluding the thickness of the first supporting layer 22. That is, the plugging effect of the first supporting layer 22 on the holes on the side walls of the groove-type lower electrode is not considered.

In some embodiments, the thickness of the first supporting layer is considered, that is, the height difference is the distance between the bottom surface of the capacitance tank and the top surface of the first supporting layer. In this way, it is beneficial to improve the position flexibility of the first supporting layer, to reduce the position accuracy requirement of the first supporting layer, and to increase the process feasibility.

Figure 10:
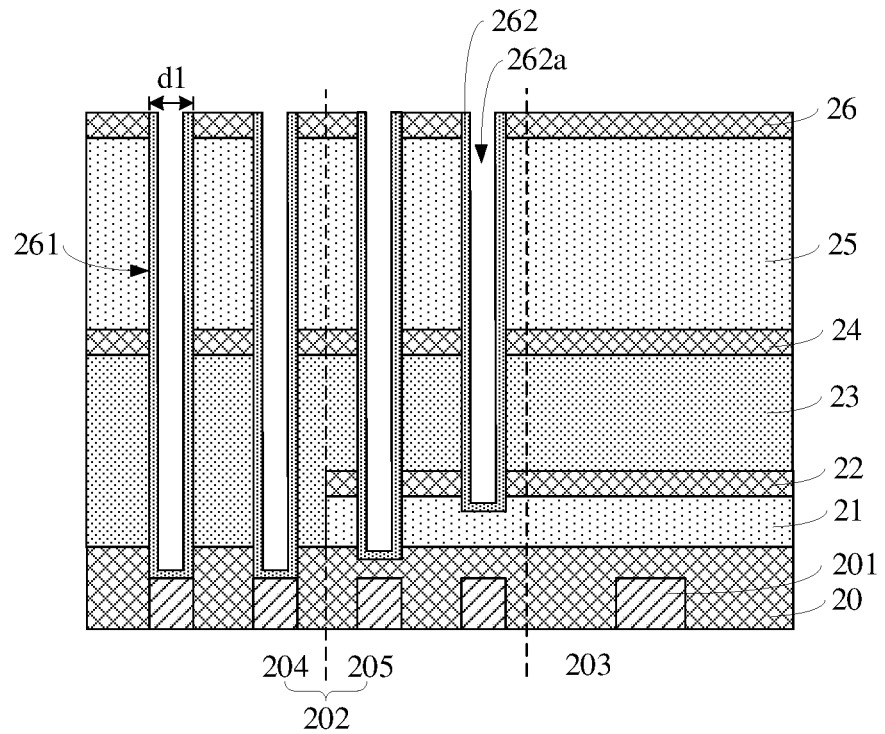

Referring to FIG. 10, in the same formation process, the groove-type lower electrodes 262 arranged in the buffer area 205 and the functional area 204 are formed.

During the process of forming the groove-type lower electrodes 262, since the width d1 of the top opening of the capacitance tank 261 in the buffer area 205 is relatively small, and the depth-to-width ratio is relatively large, the deposition of the electrode material through the deposition process may have the problems of uneven depositing thickness and formation of holes, etc. The problem of formation of holes usually occurs in the corner area at the bottom portion of the groove-type lower electrode 262, thus, the smaller the width d1 of the top opening is, the more serious the problem of formation of holes is.

Each groove-type lower electrode 262 is provided with an electrode tank 262a. The etching solution may contact the first dielectric layer 21 through the electrode tank 262a and the holes, so as to etch the first dielectric layer 21.

Figure 11:
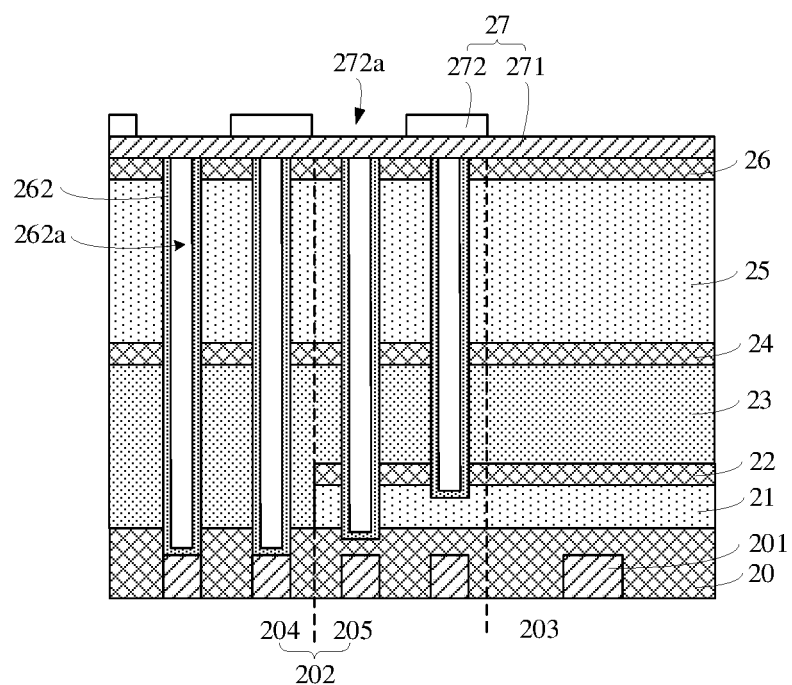

Referring to FIG. 11, a mask layer 27 is formed, so as to patterned etch the third supporting layer 26.

The mask layer 27 includes a hard mask layer 271 and a photoresist layer 272. The photoresist layer 272 is provided with a patterned opening 272a, which is configured to define an area to be etched of the third supporting layer 26.

In this embodiment, in the direction perpendicular to the surface of the substrate 20, the orthographic projection of the patterned opening 272a is overlapped with the orthographic projection of a portion of the groove-type lower electrodes 262, and the orthographic projection of the photoresist layer 272 is overlapped with the orthographic projection of the groove-type lower electrode 262 of which the bottom surface is located in the first dielectric layer 21. In this way, it is beneficial to ensure that the remaining portion of the mask layer 27 may plug the top opening of the specific groove-type lower electrode 262 after etching the third supporting layer 26.

Figure 12:
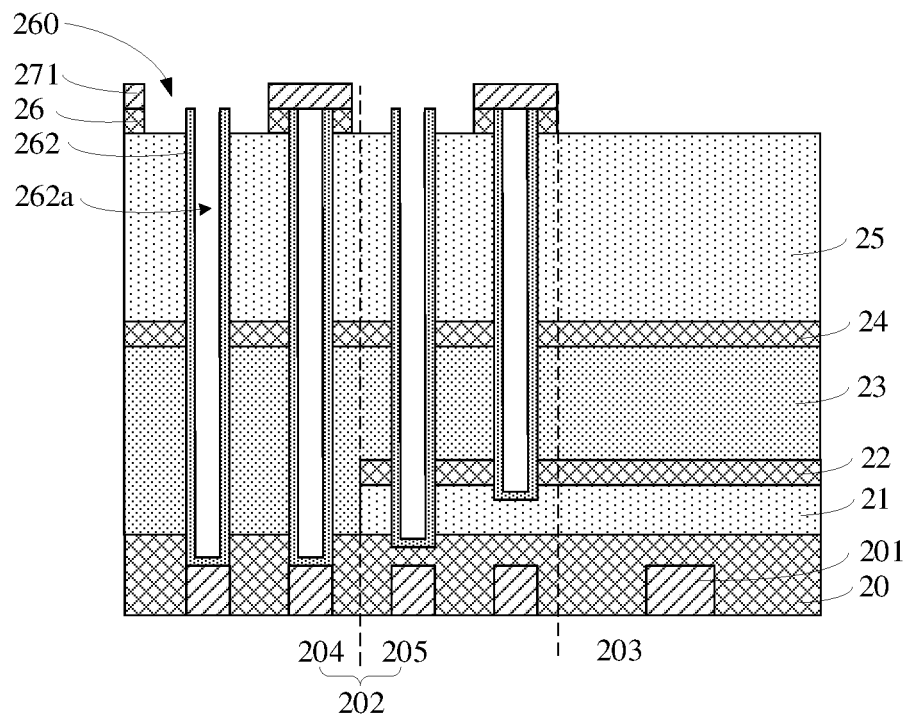

Referring to FIG. 12, the third supporting layer 26 is etched to form a first opening 260.

In this embodiment, after forming the first opening 260, the photoresist layer 272 (referring to FIG. 11) is removed, and the hard mask layer 271 is retained. The remaining portion of the hard mask layer 271 is configured to plug the top opening of the groove-type lower electrode 262, so as to avoid the etching solution from contacting the first dielectric layer 21 through the electrode tank 262a and the bottom holes when subsequently etching the third dielectric layer 25, thereby ensuring that the first dielectric layer 21 has a better structural integrity.

In this embodiment, the first opening 260 exposes the electrode tank 262a of a portion of the groove-type lower electrodes 262. In other embodiments, in the direction perpendicular to the surface of the substrate, the orthographic projection of the first opening is not overlapped with the orthographic projection of the groove-type lower electrode. In this way, it is beneficial to avoid the etching solution for etching the third dielectric layer from entering the electrode tank of any one of the groove-type lower electrodes, thereby further ensuring the structural integrity of each of the first dielectric layer and the second dielectric layer.

Figure 13:
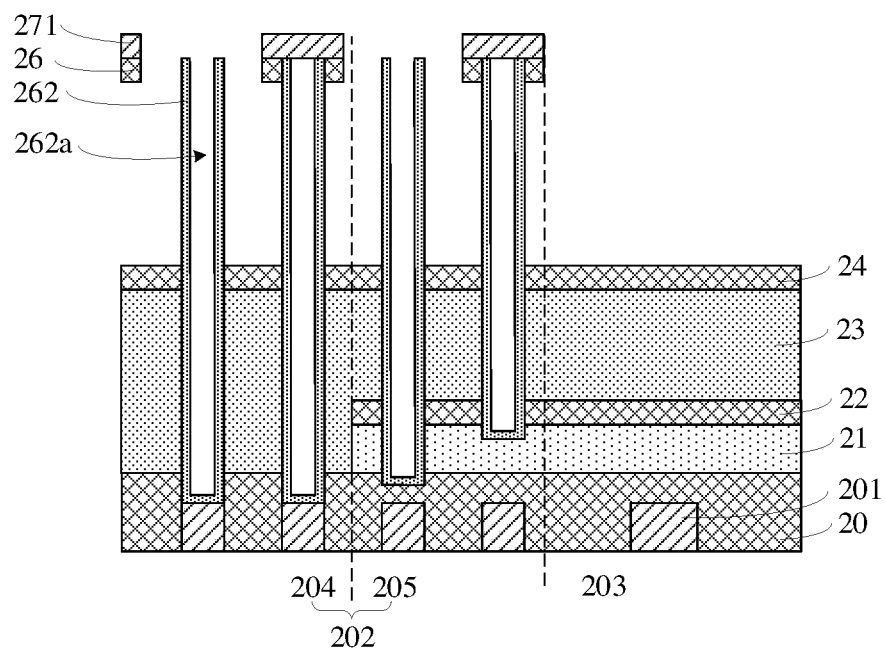
Figure 14:
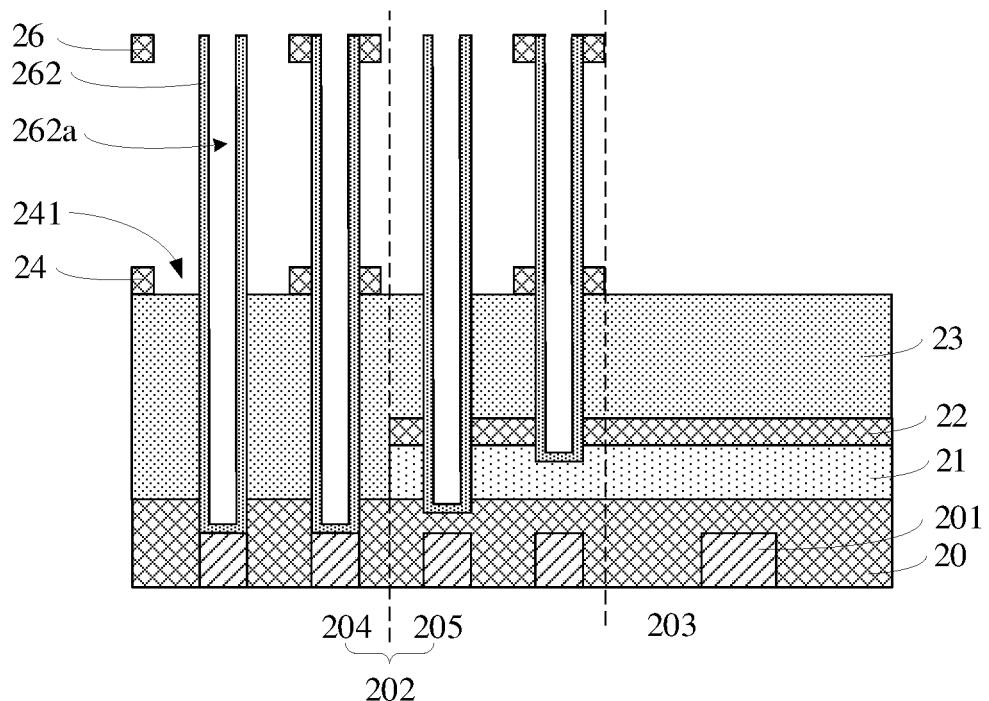

Referring to FIG. 13 and FIG. 14, the third dielectric layer 25 (referring to FIG. 12) is removed, and the second supporting layer 24 is etched to form the second opening 241.

During the process of removing the third dielectric layer 25, due to the plugging of the hard mask layer 271, the etching solution will not enter the electrode tank 262a of the specific groove-type lower electrode 262, and will not etch the first dielectric layer 21 through the bottom holes, so that the first dielectric layer 21 has a better structural integrity.

In this embodiment, the second supporting layer 24 and the remaining portion of the hard mask layer 271 may be simultaneously etched through a mask-less dry etching process, so as to remove the hard mask layer 271 and form the second openings 241 in the array area 202 and the peripheral area 203. Since the height difference between the top surface of the second dielectric layer 23 and the top surface of the groove-type lower electrode 262 is relatively large, when the second dielectric layer 23 is subsequently wet-etched, the etching solution is less likely to enter the electrode tank 262a. Therefore, when the second dielectric layer 23 is etched, the remaining portion of the hard mask layer 271 may be removed.

In this embodiment, during the process of removing the second supporting layer 24 in the peripheral area 203, since the second dielectric layer 23 has a better structural integrity, and the etch selectivity ratio of the second dielectric layer 23 to the second supporting layer 24 is relatively large, the second dielectric layer 23 may effectively isolate the etching solution for etching the second supporting layer 24, so as to prevent the etching solution from contacting the substrate 20, thereby ensuring that the substrate 20 and the conductive structure 201 have good performances.

Figure 15:
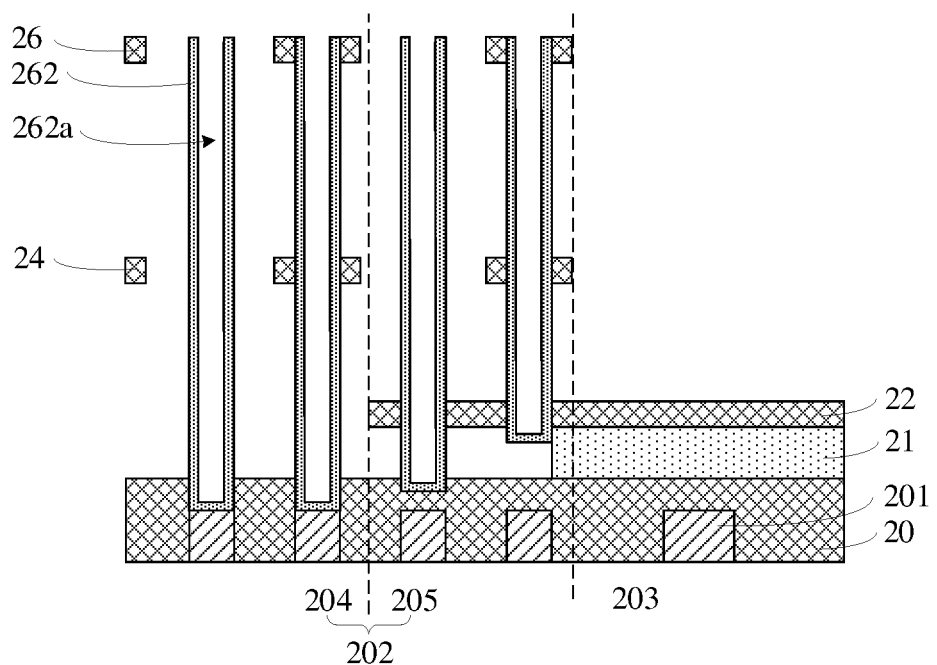

Referring to FIG. 15, the second dielectric layer 23 (referring to FIG. 14) is removed.

In this embodiment, since the first dielectric layer 21 contacts the second dielectric layer 23, a portion of the first dielectric layer 21 may be removed by etching when the second dielectric layer 23 is etched, and the remaining portion of the first dielectric layer 21 may play a role of electrical isolation and support. It should be noted that the capacitance structure in the buffer area 205 is usually set only to make the overall logic of the semiconductor structure correct, or to ensure that the capacitance structure in the functional area 204 is normal. The capacitance structure in the buffer area 205 generally does not play a role of data storage. Thus, the position of the first dielectric layer 21 in the buffer area 205 will not affect the performance of the semiconductor structure.

Figure 16:
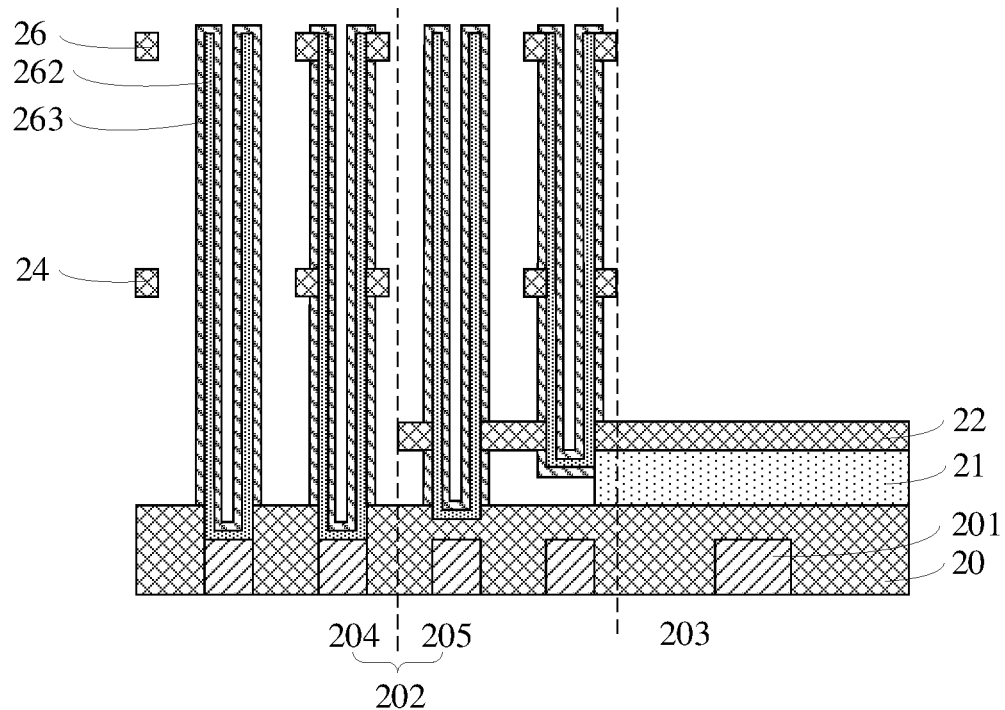
Figure 17:
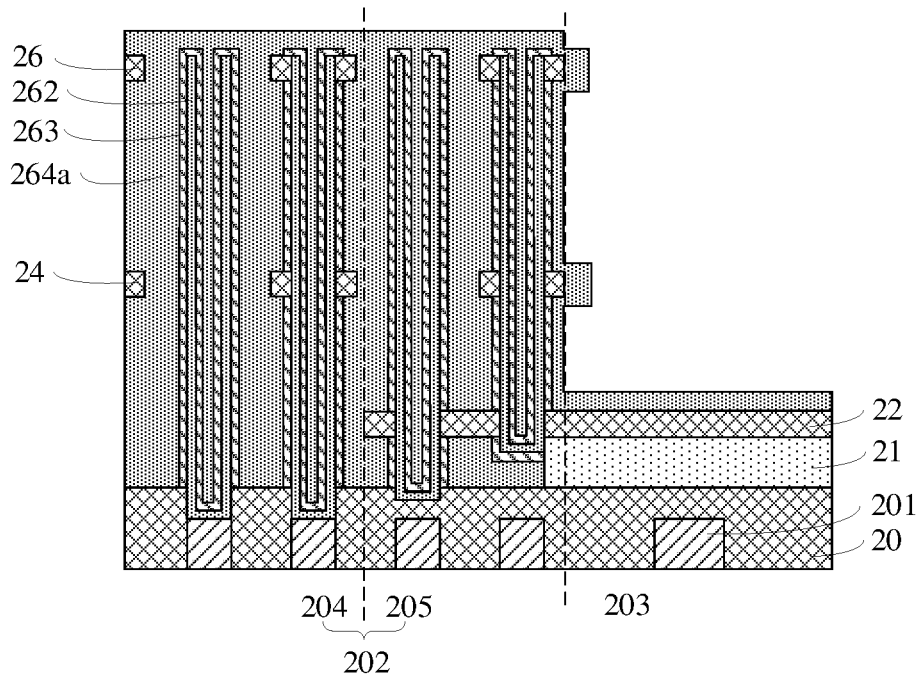
Figure 18:
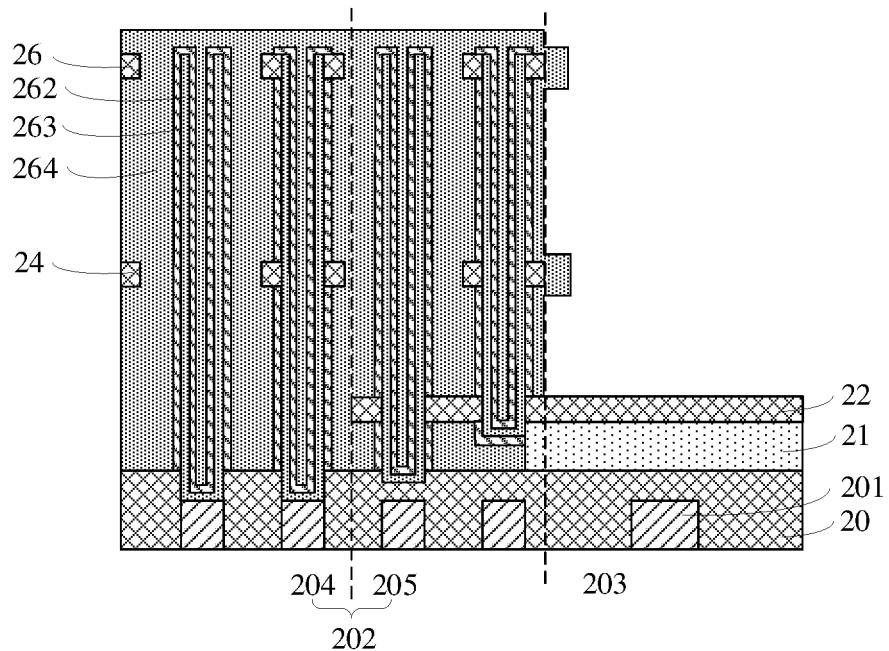

Referring to FIG. 16 to FIG. 18, a dielectric layer 263 and an upper electrode 264 are formed.

In this embodiment, the dielectric layer 263 covering the surface of the groove-type lower electrode 262 is formed through the deposition process. The upper electrode film 264a covering the first dielectric layer 21, the first supporting layer 22, the dielectric layer 263, the second supporting layer 24 and the third supporting layer 26 is formed through the deposition process. After forming the upper electrode film 264a, the upper electrode film 264a in the peripheral area 203 is removed, so as to form the upper electrode 264, so that the upper electrode 264 is avoided from electrically contacting the second conductive plug subsequently formed.

Figure 19:
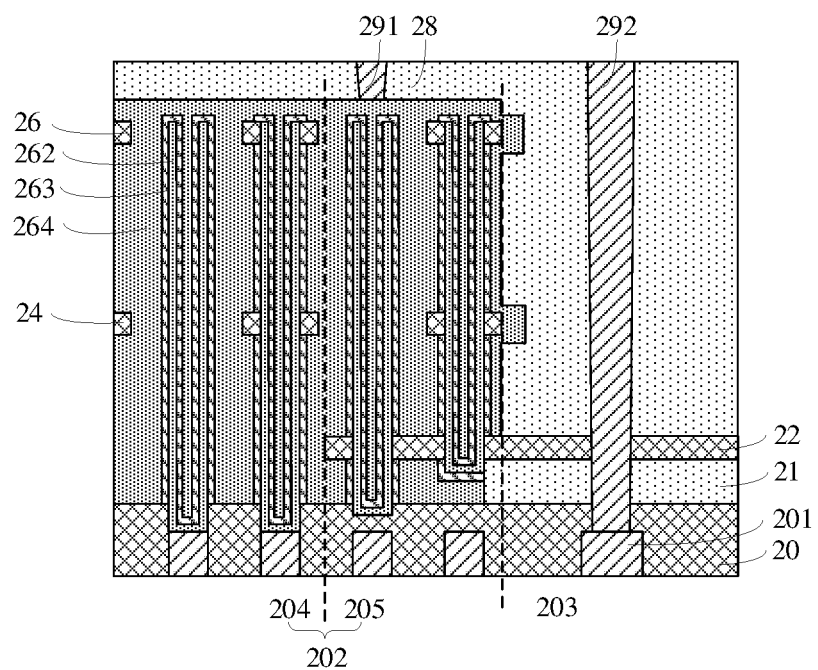

Referring to FIG. 19, an isolation layer 28, a first conductive plug 29 and a second conductive plug 292 are formed.

In this embodiment, after forming the upper electrode 264, the isolation layer 28 covering the top surface of the upper electrode 264 and filling the peripheral area 203 may be formed through the deposition process. After forming the isolation layer 28, the first conductive plug 291, which penetrates through the isolation layer 28 and is electrically connected to the upper electrode 264, is formed, and the second conductive plug, which penetrates through the isolation layer 28 and is connected to the conductive structure 201 in the peripheral area 203, is formed.

In this embodiment, the dielectric layer between the second supporting layer and the substrate is divided into two layers by forming the first supporting layer in the peripheral area, and the bottom surface of the groove-type lower electrode is located in the first dielectric layer or the second dielectric layer, so as to ensure that the leaking etching solution can only form the leakage hole in one of the dielectric layers, so that the other dielectric layer can effectively isolate the etching solution for etching the second supporting layer.

According to another embodiment of the disclosure, a method for manufacturing a semiconductor structure is further provided. Different from the previous embodiment, in this embodiment, the first dielectric layer in the functional area is only doped. Detail description is made in combination with FIG. 20 to FIG. 23. FIG. 20 to FIG. 23 are schematic diagrams of structures corresponding to various operations in a method for manufacturing a semiconductor structure according to another embodiment of the disclosure. The part, which is the same as or corresponds to the previous embodiment, is described with reference to the corresponding description of the previous embodiment, which is not repeated hereinafter.

Figure 20:
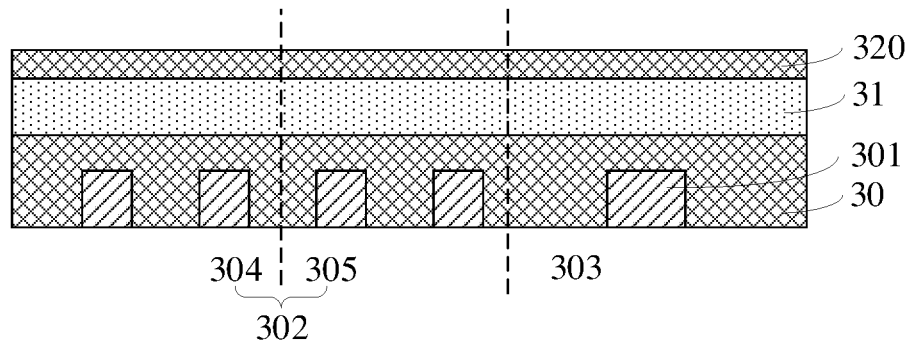
FIG. 20-FIG. 23 are schematic diagrams of structures corresponding to various operations in a method for manufacturing a semiconductor structure according to another embodiment of the disclosure.

Referring to FIG. 20, a first dielectric layer 31 and a first supporting film 320 are formed on the substrate 30. The first supporting film 320 covers the array area 302 and the peripheral area 303.

Figure 21:
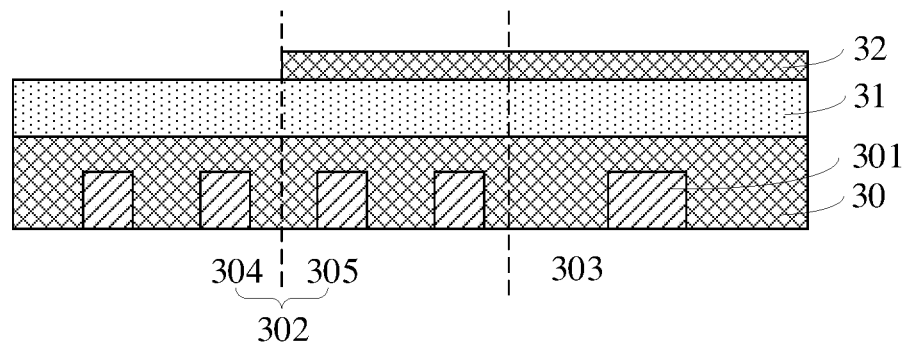
Figure 22:
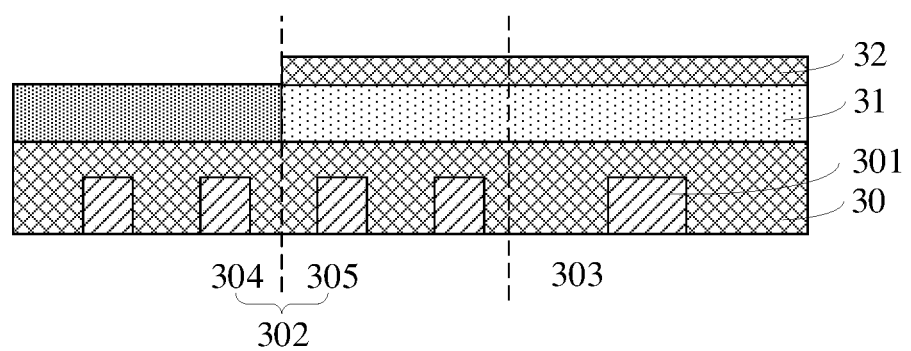

Referring to FIG. 21, the first supporting film 320 (referring to FIG. 20) in the functional area 304 is removed, so as to form the first supporting layer 32 in the buffer area 305 and the peripheral area 303. Referring to FIG. 22, by using the first supporting layer 32 as a mask, the first dielectric layer 31 in the functional area 304 is performed ions doping, so that the etching rate of the first dielectric layer 31 in the functional area 304 in the wet etching process is increased.

Figure 23:
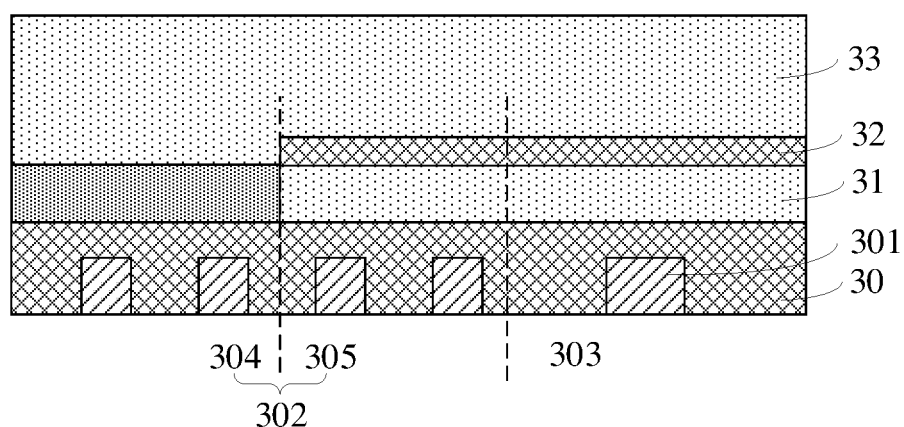

Referring to FIG. 23, a second dielectric layer 33 covering the top surface of the first supporting layer 32 and the top surface of the first dielectric layer 31 is formed.

In this embodiment, a new manufacturing method is provided, so that the materials in different areas of the first dielectric layer have different etching selection ratios. In this way, it is beneficial to stop the wet etching process in time after etching the first dielectric layer 31 in the functional area 304, so as to prevent the first dielectric layer 31 in the buffer area 305 and the peripheral area 303 from being over-etched.

Correspondingly, an embodiment of the disclosure further provides a semiconductor structure, which may be manufactured through the method for manufacturing the semiconductor structure described above.

Referring to FIG. 19, the semiconductor structure includes: a substrate 20, in which the substrate includes an array area 202 and a peripheral area 203 adjacent to each other, and the array area 202 includes a buffer area 205 connected to the peripheral area 203; a first supporting layer 22 and a second supporting layer 24, in which the first supporting layer 22 is arranged in the peripheral area 203, the second supporting layer 24 is arranged in the array area 202, and the second supporting layer 24 is higher than the first supporting layer 22; a groove-type lower electrode 262, in which the groove-type lower electrode 262 is arranged in the buffer area 205 and penetrates through the second supporting layer 24, a bottom surface the groove-type lower electrode 262 is higher than a surface of the substrate 20 and lower than the first supporting layer 22, or a bottom surface the groove-type lower electrode 262 is higher than the first supporting layer 22 and lower than the second supporting layer 24.

In this embodiment, the bottom surface of the groove-type lower electrode 262 is higher than the surface of the substrate 20 and lower than the first supporting layer 22. The first supporting layer 22 is also arranged in the buffer area 205 and configured to support the groove-type lower electrode 262.

In this embodiment, in a direction perpendicular to the surface of the substrate 20, the height difference between the bottom surface of the groove-type lower electrode 262 and the first supporting layer 22 is comprised between 90 nm and 110 nm, for example, 95 nm, 100 nm or 105 nm.

In this embodiment, a conductive structure 201 is provided in the substrate 20. The semiconductor structure further includes a first dielectric layer 21 arranged between the first supporting layer 22 and the substrate 20. In a direction perpendicular to the surface of the substrate 20, an orthographic projection of at least one conductive structure 201 in the peripheral area 203 is located in an orthographic projection of the first dielectric layer 21. In this way, it is beneficial to ensure that the first dielectric layer 21 can isolate the second conductive plug 292 from the upper electrode 264.

In this embodiment, the semiconductor structure further includes: an upper electrode 264, in which the upper electrode 264 covers an inner wall and an outer wall of the groove-type lower electrode 262 to form a double-sided capacitance structure, and a dielectric layer 263 is provided between the upper electrode 264 and the groove-type lower electrode 262; a first conductive plug 291 electrically connected to the upper electrode 264; and a second conductive plug 292 electrically connected to at least one conductive structure 201 in the peripheral area 203.

In this embodiment, the semiconductor structure further includes: a third supporting layer 26, in which the third supporting layer 26 is arranged in the array area 202 and higher than the second supporting layer 24, and the groove-type lower electrode 262 penetrates through the third supporting layer 26; and an isolation layer 28, in which the isolation layer is arranged in the array area 202 and the peripheral area 203, and each of the first conductive plug 291 and the second conductive plug 292 penetrates through the isolation layer 28.

In this embodiment, a semiconductor structure is provided. The semiconductor structure includes a first supporting layer arranged in the peripheral area. The first supporting layer may be configured to define the etching range of the etching solution flowing out of the bottom portion of the groove-type lower electrode, so as to ensure the integrity of the structures in other areas, thereby protecting the substrate.

Compared with the related art, the technical solutions provided by the embodiments of the disclosure have the following advantages.

In the abovementioned technical solutions, the dielectric layer between the second supporting layer and the substrate is divided into the first dielectric layer and the second dielectric layer through a first isolation layer. If the bottom portion of the groove-type lower electrode has a hole defect, and the etching solution may leak through the hole defect, in a process of etching the third dielectric layer, only one of the first dielectric layer and the second dielectric layer will be etched by the leaking etching solution, so as to form a leakage hole. That is to say, at least one of the first dielectric layer and the second dielectric layer between the second supporting layer and the substrate in the peripheral area is intact. In this way, when the second supporting layer in the peripheral area is removed by etching, the etching solution will not directly contact the substrate in the peripheral area due to the existence of the leakage hole, so as to avoid damage to the substrate in the peripheral area.

Those of ordinary skill in the art may understand that the above embodiments are specific embodiments to implement the disclosure. In practical applications, various changes may be made in forms and details without deviating from the spirit and scope of the disclosure. Any person skilled in the art may make change and modifications without deviating from the spirit and scope of the disclosure. Therefore, the protection scope of the disclosure should be subjected the scope defined by the appended claims.

The invention claimed is:

1. A method for manufacturing a semiconductor structure, comprising:
   providing a substrate, wherein the substrate comprises an array area and a peripheral area adjacent to each other, and the array area comprises a buffer area connected to the peripheral area;
   forming a first dielectric layer, a first supporting layer, a second dielectric layer, a second supporting layer and a third dielectric layer, which are successively stacked onto one another, on the substrate, wherein the first supporting layer is arranged at least in the peripheral area, the first dielectric layer is arranged between the first supporting layer and the substrate, the second dielectric layer covers the first supporting layer and the substrate, and each of the second supporting layer and the third dielectric layer is arranged in the array area and the peripheral area;
   forming a groove-type lower electrode, which at least penetrates through the third dielectric layer and the second supporting layer, in the buffer area, wherein a bottom surface of the groove-type lower electrode is located in the first dielectric layer or in the second dielectric layer;
   removing the third dielectric layer through a wet etching process; and
   etching the second supporting layer in the peripheral area after removing the third dielectric layer.

2. The method for manufacturing the semiconductor structure of claim 1, wherein the method comprises: removing the second dielectric layer after etching the second supporting layer.

3. The method for manufacturing the semiconductor structure of claim 2, wherein the method comprises: after forming the second dielectric layer and before forming the second supporting layer, performing ions doping to the second dielectric layer to increase an etching rate of the second dielectric layer in the wet etching process.

4. The method for manufacturing the semiconductor structure of claim 2, wherein a conductive structure is provided in the substrate, and the method comprises: forming an upper electrode covering an inner wall and an outer wall of the groove-type lower electrode after removing the second dielectric layer; and forming a first conductive plug and a second conductive plug, the first conductive plug being electrically connected to the upper electrode, and the second conductive plug being electrically connected to the conductive structure in the peripheral area.

5. The method for manufacturing the semiconductor structure of claim 4, wherein the method comprises: forming an upper electrode film covering a surface of the first supporting layer, a surface of the second supporting layer and a surface of the groove-type lower electrode through a deposition process; removing the upper electrode film in the peripheral area to form the upper electrode; forming an isolation layer arranged in the array area and in the peripheral area through a deposition process; and forming the first conductive plug and the second conductive plug which penetrate through the isolation layer, the isolation layer isolating the upper electrode from the second conductive plug.

6. The method for manufacturing the semiconductor structure of claim 1, wherein the array area comprises a functional area in a center of the array area and the buffer area at an edge of the array area, and wherein a plurality of groove-type lower electrodes in the buffer area and in the functional area are formed through a same formation process, a width of an opening of each groove-type lower electrode in the functional area being greater than a width of an opening of each groove-type lower electrode in the buffer area in a direction from the array area to the peripheral area.

7. The method for manufacturing the semiconductor structure of claim 1, wherein the method comprises: forming a third supporting layer covering the third dielectric layer after forming the third dielectric layer, and wherein removing the third dielectric layer comprises: etching the third supporting layer to form a first opening, and etching and removing the third dielectric layer through the first opening.

8. A semiconductor structure, comprising:
a substrate, wherein the substrate comprises an array area and a peripheral area adjacent to each other, and the array area comprises a buffer area connected to the peripheral area;
a first supporting layer and a second supporting layer, wherein the first supporting layer is arranged in the peripheral area, the second supporting layer is arranged in the array area, and the second supporting layer is higher than the first supporting layer; and
a groove-type lower electrode, wherein the groove-type lower electrode is arranged in the buffer area and penetrates through the second supporting layer, a bottom surface of the groove-type lower electrode is higher than a surface of the substrate and lower than the first supporting layer, or a bottom surface of the groove-type lower electrode is higher than the first supporting layer and lower than the second supporting layer.

9. The semiconductor structure of claim 8, wherein the bottom surface of the groove-type lower electrode is higher than the surface of the substrate and lower than the first supporting layer, and the first supporting layer is also arranged in the buffer area and configured to support the groove-type lower electrode.

10. The semiconductor structure of claim 8, wherein the bottom surface of the groove-type lower electrode is higher than the surface of the substrate and lower than the first supporting layer, and a height difference between the bottom surface of the groove-type lower electrode and the first supporting layer is comprised between 90 nm and 110 nm in a direction perpendicular to the surface of the substrate.

11. The semiconductor structure of claim 8, wherein a plurality of conductive structures are provided in the substrate, and the semiconductor structure further comprises a first dielectric layer arranged between the first supporting layer and the substrate, and wherein an orthographic projection of at least one of the conductive structures in the peripheral area is located in an orthographic projection of the first dielectric layer in a direction perpendicular to the surface of the substrate.

12. The semiconductor structure of claim 11, further comprising an upper electrode covering an inner wall and an outer wall of the groove-type lower electrode; a first conductive plug electrically connected to the upper electrode; and a second conductive plug electrically connected to the at least one of the conductive structures in the peripheral area.

13. The semiconductor structure of claim 12, further comprising: a third supporting layer, the third supporting layer being arranged in the array area and higher than the second supporting layer, and the groove-type lower electrode penetrating through the third supporting layer; and an isolation layer, the isolation layer being arranged in the array area and the peripheral area, and the first conductive plug and the second conductive plug penetrating through the isolation layer.

* * * * *